United States Patent
Boury et al.

(10) Patent No.: US 12,313,661 B2
(45) Date of Patent: May 27, 2025

(54) CURRENT SUPERVISORY DEVICE WITH RELIABLE EVENT REPORTING

(71) Applicant: Melexis Technologies SA, Bevaix (CH)

(72) Inventors: Bruno Boury, Tessenderlo (BE); Asparuh Grigorov, Sofia (BG); Stephane Rauw, Tessenderlo (BE)

(73) Assignee: MELEXIS TECHNOLOGIES SA, Bevaix (CH)

(*) Notice: Subject to any disclaimer, the term of this patent is extended or adjusted under 35 U.S.C. 154(b) by 127 days.

(21) Appl. No.: 18/148,106

(22) Filed: Dec. 29, 2022

(65) Prior Publication Data
US 2023/0204637 A1    Jun. 29, 2023

(30) Foreign Application Priority Data

Dec. 29, 2021  (EP) ..................................... 21218044

(51) Int. Cl.
*G01R 19/25* (2006.01)
*G01R 19/165* (2006.01)
*G01R 19/32* (2006.01)

(52) U.S. Cl.
CPC ... *G01R 19/16571* (2013.01); *G01R 19/2513* (2013.01); *G01R 19/32* (2013.01)

(58) Field of Classification Search
CPC .......... G01R 19/16571; G01R 19/0092; G01R 19/16528; G01R 19/165
See application file for complete search history.

(56) References Cited

U.S. PATENT DOCUMENTS

| | | | | |
|---|---|---|---|---|
| 3,727,128 A | * | 4/1973 | McFerrin | G01R 31/11 324/533 |
| 2009/0096520 A1 | * | 4/2009 | Bas | H03D 1/00 329/347 |
| 2010/0165521 A1 | * | 7/2010 | Changali | H02H 1/0015 361/42 |
| 2010/0295492 A1 | | 11/2010 | Chakrabarti et al. | |
| 2012/0147630 A1 | * | 6/2012 | Cao | H02M 3/33507 363/21.15 |

(Continued)

FOREIGN PATENT DOCUMENTS

EP    3306765 A1    4/2018

OTHER PUBLICATIONS

Extended European Search Report for EP Application No. 21218044.2, Jul. 8, 2022.

*Primary Examiner* — Lee E Rodak
*Assistant Examiner* — Demetrius R Pretlow
(74) *Attorney, Agent, or Firm* — Workman Nydegger

(57) ABSTRACT

A current supervisory device includes current sensing means for sensing a current; a circuit arranged to convert a signal received from the current sensing means into a signal indicative of the sensed current; a processing circuit arranged to receive the signal indicative of the sensed current, to detect an event based on the received signal such that the detecting yields an outcome corresponding to one of at least two different states, and to generate an event signal in accordance with the outcome, such that the processing circuit has modulation means for performing modulation based on the event signal; and an output terminal arranged to output a reporting signal received from said processing circuit, whereby at least one of at least two different states gives rise to the reporting signal being a modulated signal.

17 Claims, 5 Drawing Sheets

(56) References Cited

U.S. PATENT DOCUMENTS

| | | | |
|---|---|---|---|
| 2012/0250367 A1* | 10/2012 | Desimone | H02M 3/3381 |
| | | | 363/21.17 |
| 2013/0321966 A1 | 12/2013 | Syngaevskiy et al. | |
| 2014/0268925 A1* | 9/2014 | Lee | H02M 3/33507 |
| | | | 363/21.18 |
| 2014/0328427 A1 | 11/2014 | Chang et al. | |
| 2017/0074919 A1* | 3/2017 | Davidson | G01R 31/086 |
| 2019/0041462 A1* | 2/2019 | Narasimha | G01R 31/346 |
| 2019/0293694 A1* | 9/2019 | Petrie | G01R 15/20 |

\* cited by examiner

CURRENT SUPERVISORY DEVICE WITH RELIABLE EVENT REPORTING

FIELD OF THE INVENTION

The present invention is generally related to the field of supervisory devices comprising current sensors as used for example in vehicles.

BACKGROUND OF THE INVENTION

Current sensors are used in a wide variety of applications, ranging from electrical vehicles (EVs), battery monitoring, EV charging stations to solar inverters, for example. In many applications, an overcurrent in an electrical system must be quickly and reliably detected. Therefore, many of semiconductor integrated circuit devices are conventionally provided with an overcurrent protection circuit as one of their abnormality protection circuits. Short circuit is a type of overcurrent. For example, an in-vehicle intelligent power device is provided with an overcurrent protection circuit, which restricts the amount of output current flowing through a power transistor not to exceed an overcurrent set value, for the purpose of preventing the device from breaking in a case of a short-circuit in a load connected to the power transistor. Circuit breakers, e.g., magnetic circuit breakers, fuses and overcurrent relays are commonly used to provide overcurrent protection mechanisms.

As an overcurrent event can potentially damage the system and even lead to a danger for a user, the system is usually arranged to perform a safety action when such an event occurs. For example, the electrical source may be disconnected from the load by opening a relay or blowing a fuse. Therefore, an overcurrent event must not only be reliably detected by the current sensor, but it also needs to be reliably reported, or communicated to the system electronic control unit (ECU).

Prior art solutions are known wherein an overcurrent event is reported as a digital output, e.g., as a binary signal. If no overcurrent is detected (i.e., the measured current is lower than a predetermined threshold), the digital output is set to a logical low state and in the opposite case, if an overcurrent is detected (i.e., I>said threshold), the digital output is set to a logical high state (or vice-versa). Such a type of communication is not immune to electromagnetic interferences. A further drawback is that an electronic control unit cannot diagnose a failure in the overcurrent reporting unit, as it only receives an indication of whether or not overcurrent has occurred.

There is thus a need for a device wherein events like overcurrent can be detected and next reported in a more reliable way.

SUMMARY OF THE INVENTION

It is an object of embodiments of the present invention to provide for current supervisory device that allows for safe reporting on a detected event like e.g., the occurrence of an overcurrent.

The above objective is accomplished by the solution according to the present invention.

In a first aspect the invention relates to a current supervisory device comprising:
current sensing means for sensing a current,
a circuit arranged to convert a signal received from the current sensing means into a signal indicative of the sensed current,
a processing circuit arranged to receive the signal indicative of the sensed current, to detect an event based on the received signal, said detecting yielding an outcome corresponding to one of at least two different states, and to generate an event signal in accordance with the outcome, said processing circuit comprising modulation means for performing modulation based on the event signal,
an output terminal arranged to output a reporting signal received from the processing circuit, whereby at least one of at least two different states gives rise to said reporting signal being a modulated signal.

The proposed solution indeed allows for the use of a modulated signal to report the detection of an event, for example the occurrence or non-occurrence of an overcurrent. The processing circuit of the current supervisory device detects the event. The outcome indicates one of at least two states (typically occurrence or non-occurrence) and is used to generate an event signal. The processing circuit outputs an output signal to the output terminal. The modulation means provided in the processing circuit are configured to modulate a reporting signal at least in case one of the at least two different states is detected. For example, the current supervisory device may output a modulated signal as reporting signal as long as no fault (e.g., an overcurrent) is detected. When the processing circuit detects an overcurrent, the reporting signal may turn into a non-modulated signal. However, it may also be that in that case another modulated signal is emitted as reporting signal, with at least one different modulation parameter.

In a preferred embodiment the modulation means is arranged to adapt a pulse width of pulses of said reporting signal. In other words, the duty cycle of the pulses is adaptable.

In a preferred embodiment the modulated signal is modulated in frequency.

In yet further preferred embodiments the modulated signal is modulated both in frequency and in pulse width.

In preferred embodiments the modulated signal is a one-bit signal.

Advantageously the processing circuit comprises pulse shaping means for generating the reporting signal, said reporting signal being a pulsed signal.

In some embodiments the modulated signal has a frequency higher than the operational bandwidth or cycle of said current supervisory device, for example two times higher or ten times higher.

In advantageous embodiments the modulated signal is the modulated event signal.

In other embodiments the generated event signal is e.g., used as a trigger signal for the modulation means to produce a modulated signal.

In some embodiments the processing circuit is arranged to detect the event by comparing the received signal with a predefined threshold. The processing circuit is then preferably arranged to detect the event by comparing the received signal with a plurality of predefined thresholds, whereby with each predefined threshold corresponds a different event signal and consequently to a different modulated signal.

In a preferred embodiment the event is the occurrence or non-occurrence of a fault. The fault may for example be an overcurrent.

Advantageously, the processing circuit is arranged to output for a further state of the at least two different states a further modulated signal having at least one modulation parameter different from the modulated signal.

In another embodiment the current sensing means comprises a shunt resistor for generating a voltage drop and/or a magnetic sensing element.

In one embodiment the current supervisory device further comprises voltage detection means for sensing a voltage and/or temperature detection means for sensing a temperature, and the modulation means of the processing circuit is arranged for modulating the output signal based on said event signal and on a signal indicative of the sensed voltage and/or the sensed temperature.

In some embodiments the current supervisory device comprising a further output terminal arranged for outputting the signal indicative of the sensed current.

In another aspect the invention relates to a system comprising a current supervisory device as previously described and an electronic device arranged to receive the modulated event signal. The electronic device may for example be an electronic control unit if a vehicle, a fuse or a circuit breaker.

In advantageous embodiments the system comprises filtering means to filter the modulated event signal before applying the modulated event signal to the electronic control unit.

In another embodiment the filtering means have a cut-off frequency lower than the modulated signal frequency.

In another embodiment the system comprises further comparing means to compare said modulated signal with a predetermined threshold level.

In some embodiments the current supervisory device comprises a low-pass filter having a cut-off frequency higher than the frequency of the modulated signal and is arranged to shape bandwidth limited pulses.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

DETAILED DESCRIPTION OF ILLUSTRATIVE EMBODIMENTS

Figure 1:
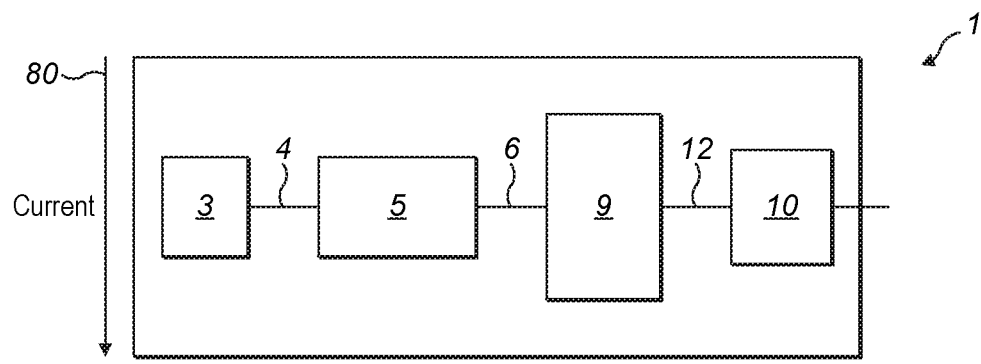
FIG. 1 illustrates a high-level block scheme of a current supervisory device according to embodiments of the present invention.

The present invention will be described with respect to particular embodiments and with reference to certain drawings, but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

The present invention discloses a current supervisory device arranged to detect an event, e.g. the occurrence or non-occurrence of a fault like an overcurrent, and to report about the detection by means of a modulated output signal based on an event signal generated in accordance with said detecting.

A basic block scheme of a current supervisory device (1) according to embodiments of the present invention is shown in FIG. 1. A sensor (3) is arranged to sense a current, e.g., a current in a conductor (80). The sensor output signal (4) is applied to a circuit (5) where the signal is converted into a signal (6) indicative of the sensed current, for example a digital signal comprising sampled current values. The sensed values of the current to be measured are output by the circuit (5) and fed to the processing circuit (9). The processing circuit determines (detects) based on the signal indicative of the sensed current whether or not a certain event, e.g., an overcurrent situation, has occurred. The occurrence and non-occurrence of the event can be seen as two different states. The detection may for example be established by a comparator comprised in the processing circuit that compares the received signal with a predetermined threshold value. For example, if the predetermined threshold is exceeded it is decided that an event has indeed taken place and if the signal stays under the threshold value, it is decided that the event did not occur. Obviously, also the opposite meaning can be given to the threshold level being exceeded or not. The skilled person will readily appreciate that various alternatives are available, for example making a comparison based on function of two or more sampled current values. A signal, herein referred to as event signal, is then generated in the processing circuit in accordance with the outcome of the detection, e.g., that an overcurrent situation was detected or that no overcurrent situation was detected. A reporting signal is output via an output terminal of the interface circuit. The processing circuit comprises modulation means to modulate, upon detection of at least one of the different states (e.g., occurrence or non-occurrence of an event), the reporting signal via one or more modulation parameters in accordance with the outcome of the detection. The reporting signal (12) is then applied to an output terminal (10) of an interface circuit of the current supervisory device. In some embodiments the modulated reporting signal is a modulated event signal. In other embodiments a signal based on the event signal is used to derive the modulated reporting signal. It may be in some embodiments that also another state gives rise to a reporting signal being a modulated signal. In other embodiments the reporting signal corresponding to that other state may not be modulated.

In some embodiments the interface circuit may also comprise a further output terminal for the signal indicative of the sensed current. The signal indicative of the sensed current may in some embodiments be a digital signal coming from an analog-to-digital converter (ADC) comprised for example in the circuit 5 or a digital signal supplied to the interface circuit by the processing circuit (9) comprising A/D conversion means. Alternatively, the analog signal, e.g., the signal output by an amplifier in circuit (5) can be applied to a terminal of the interface circuit. The interface then may for example have a terminal for an analog signal, i.e., an analog pin, and a terminal for a digital signal, i.e., a digital pin. However, also other options are available, as will be mentioned later in this description.

The sensor (3) is in advantageous embodiments a magnetic sensing element, e.g., a Hall sensor. Alternatively, the current sensing can be performed by means of a shunt resistor adapted to accurately produce an expected voltage for the supplied current. In case a shunt resistor is used, the current supervisory device preferably comprises a differential amplifier to sense a voltage drop across the resistor. In some embodiments the sensing means may comprise a first sensor used for current measurements and a second sensor for event detection as already mentioned. For example, the first sensor may be a Hall sensor and the second sensor a shunt resistor, or vice versa. In some embodiments the shunt resistor may be external to the device.

Figure 2:
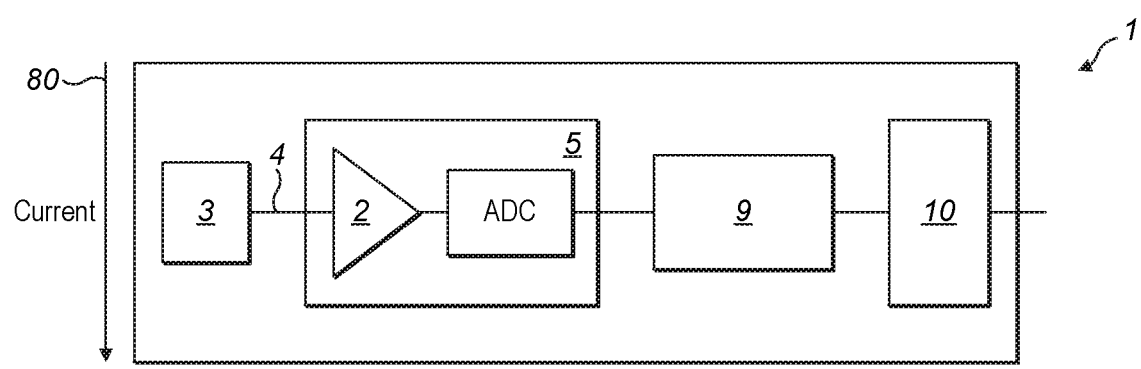
FIG. 2 illustrates a scheme of a possible digital implementation of the current supervisory device.

FIG. 2 illustrates a possible embodiment wherein the processing in the processing circuit (9) is performed in the digital domain. In FIG. 2 the circuit (5) that converts the sensor signal into a signal useful for further processing, comprises an amplifier to amplify the sensor signal and an analog-to-digital converter to obtain a digital input signal to the processing circuit. As the skilled person will readily recognize, the A/D conversion may in other embodiments be part of the processing circuit. The processing circuit (9) monitors, i.e., detects, based on the received digital signal whether an event has occurred or not. The processing may comprise a digital comparator to perform that task by comparing the received digital values with a predetermined threshold level. The threshold level may be stored in a memory in the processing circuit. Alternatively, the predetermined threshold level can be set from outside the current supervisory device and loaded into the device. For example, the threshold level may be based on (derived from) or equal to an external voltage applied to a dedicated terminal of the current supervisory device. A corresponding event signal is then generated, which is subsequently used for the reporting signal. For at least one of the states corresponding to the detection the modulation means provided in the processing circuit produce a modulated reporting signal. The reporting signal is then output via a terminal of the output interface (10). Again, it may be that in some embodiments also another state yields a modulated reporting signal, but that modulated reporting signal then has at least one different modulation parameter. Optionally, in some embodiments the processing circuit also outputs a signal corresponding to the indication of the sensed current via the interface circuit as already mentioned. This, however, is not shown in FIG. 2.

Many options are available to modulate the reporting signal based on the value of the generated event signal. Assuming that a modulation in frequency is applied, one can for example, in case no fault is detected, modulate the output signal at a frequency f1 and in case a fault was detected use a non-modulated signal, e.g., a DC signal with a given constant level. Another option could be to modulate the output signal in frequency (e.g., using frequency f1) in case no fault is detected and, in case a fault is observed, to modulate the output signal in frequency using another frequency (e.g., a frequency f2 greater than f1). The skilled person will recognize that the given options are merely examples and are in no way limiting. As an alternative, a pulse width modulation (PWM) can be employed. One possibility may be to use in case no fault is detected, as reporting signal a PWM modulated signal having frequency f1 and a duty cycle DC1, and in case a fault is detected a PWM modulated signal having the same frequency f1 but a duty cycle DC2 different from DC1. For example, DC1 may be lower than 30%, or lower than 20%, e.g., 15% and DC2 may be higher than 70%, or higher than 80%, e.g., 85%. As a further alternative the above options of applying modulation in frequency or in pulse width can be combined, so that the reporting signal is modulated both in frequency and pulse width.

Figure 3:
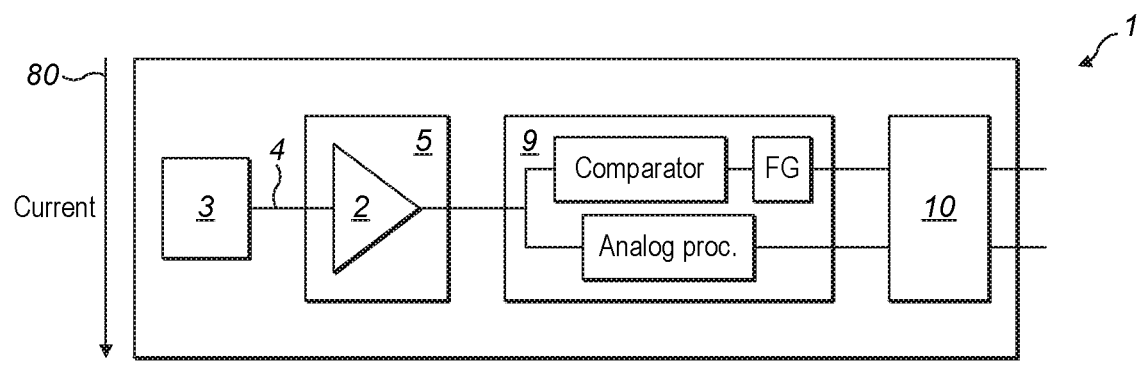
FIG. 3 illustrates an embodiment of an analog implementation of the current supervisory device.

In the embodiment shown in FIG. 3 a fully analog implementation is adopted. In circuit (5) the signal output by the sensor (3) is converted into a signal that can be used in the processing circuit. The main component of circuit (5) is an amplifier (2) to amplify the sensed signal (4) output by sensor (3). The signal output by circuit (5), e.g. the amplified signal is then fed to the processing circuit, which comprises an analog comparator that compares the amplified signal with a predefined threshold level and a corresponding event signal is applied to a frequency generator FG, where a frequency modulated reporting signal is produced and output based on the received event signal. The processing circuit in FIG. 3 comprises another, parallel path wherein the amplified signal output by circuit (5) is applied to an analog processing block. This block may optionally be connected to an output terminal of the interface circuit to output an indication of the sensed current. The analog processing block may for example perform filtering and/or clamping. It may for example also add an offset to the analog signal.

In some embodiments the current sensing means comprise more than one sensor. For example, the signal sensed by one sensor can be used, via circuit (5), which, for example, may have a second path comprising a dedicated amplifier in parallel to the path shown in FIG. 2 and FIG. 3, and the processing circuit (possibly the same processing circuit (9) is shared among the two paths), to produce an output signal indicative of the sensed current. Another sensor may then provide a sensed signal which is subsequently used as set out above to observe and detect the occurrence or non-occurrence of an event and to produce a corresponding modulated output signal based on the generated event signal to report about the event.

In one embodiment all the processing blocks in the current supervisory device (1), i.e. all blocks shown in FIGS. 1 to 3 except for the current sensing means, can be integrated in a single semiconductor package or a single integrated circuit. In other embodiments also the sensing means may be integrated.

In advantageous embodiments the reporting signal is a pulsed signal. The current supervisory device then comprises pulse shaping means. The pulse shaping means are preferably part of the processing circuit. In preferred embodiments the pulse shaping means is capable of generating bandwidth-limited pulses, e.g., pulses with smooth edges, and/or a limited rise time and a limited fall time. The bandwidth limited pulses may in some embodiments have a cut-off frequency which is higher than the modulated signal, for example five or ten times higher.

In order to monitor the possible occurrence of an event, in some embodiments the processing circuit checks at a given rate, e.g. the rate at which the signal indicative of the sensed current was sampled, whether the predetermined threshold value is exceeded or not. In some embodiments a pulse is generated when the threshold value is exceeded, and no pulse is generated otherwise. In other embodiments it is just the other way round and a pulse is only generated if the threshold value is not exceeded. In yet further embodiments a pulse of a first type is generated if the threshold value is not exceeded and a pulse of a different, second type is generated if the threshold value is exceeded. The pulses may have different pulse characteristics. Advantageously, the pulse (i.e., the reporting signal) of second type is next modulated with at least one different modulation parameter than the pulse of first type. Hence, in the latter cases a modulated reporting signal is also generated when no event is detected. This eases checking whether the reporting circuit is still alive. It further makes the reporting less sensitive to EMC perturbations (e.g., from a magnetic interference or a power supply micro-cut).

Figure 4:
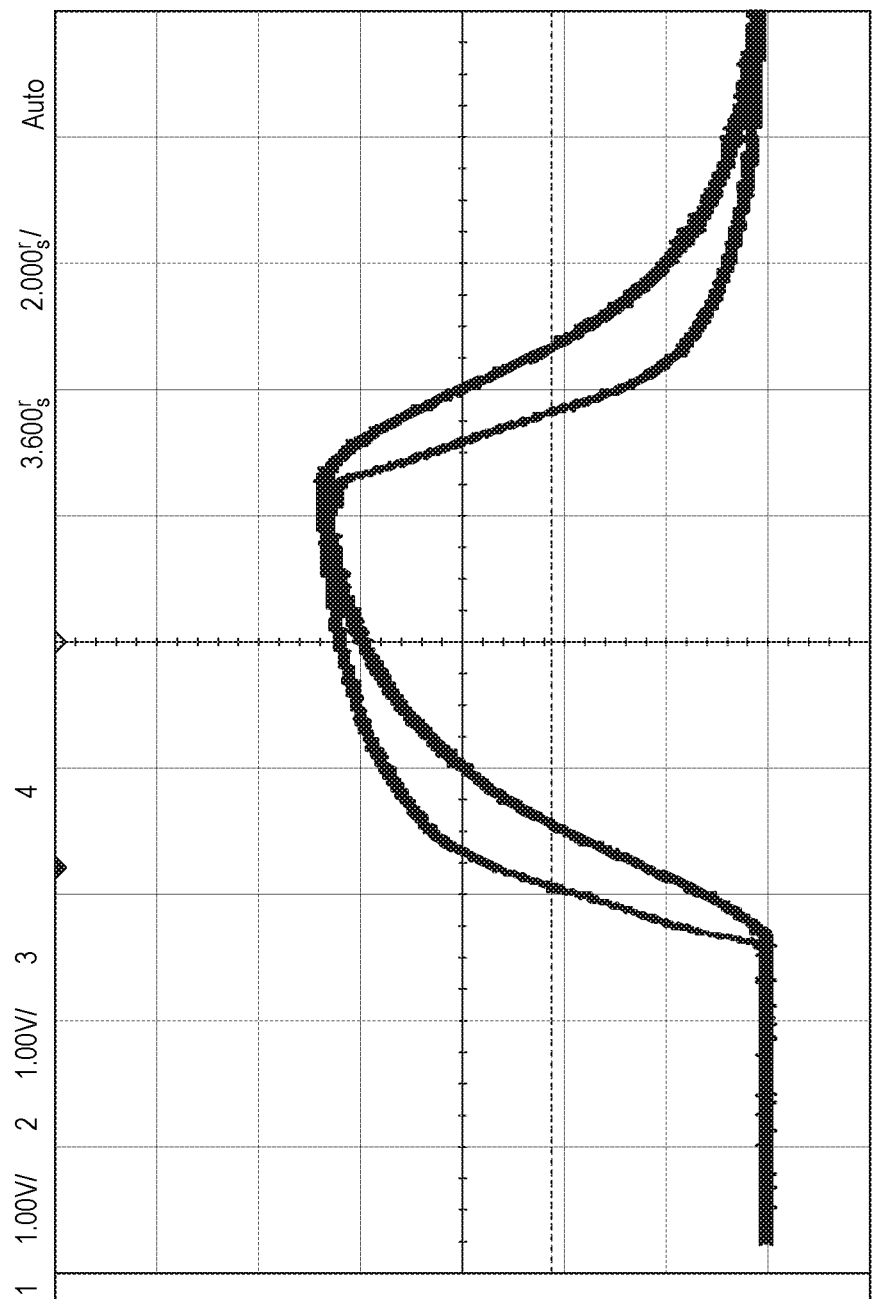
FIG. 4 illustrates an example of two bandwidth limited pulses.

In some embodiments the reporting signal forms a train of modulated pulses. In some embodiments the pulses may be rectangular pulses. In other embodiments the pulses may be bandwidth limited pulses obtained, for example, by filtering a square wave in order to remove higher harmonics and slow down the voltage transitions. The pulse shaping means can be implemented in an analog manner (e.g., via low pass filtering) or digitally, using a predetermined data sequence and a DAC, for example. In alternative embodiments the modulated output signal may be derived from a triangular signal or a sine or cosine signal. An example of a predetermined data sequence is given in FIG. 4, where two bandwidth limited pulses are shown.

The modulation means in the processing circuit can modulate the reporting signal by setting one or more appropriate modulation parameters. In a preferred embodiment the modulation means is capable of adapting the pulse width of pulses of the reporting signal. In other words, the duty cycle of the pulses can be varied. Pulses indicating that an event has been detected then have a different width than pulses indicating no event was observed. For example, in such case a pulse with a greater pulse width and consuming more power is used than in case no event occurs. For example, the duty cycle can be lower than 30%, or lower than 20%, for example 15% if no event was observed and higher than 70%, or higher than 80%, for example 85% in case there is detection of an event (e.g., overcurrent detected, or a fault in some electrical subsystem). In other embodiments, the duty cycle is higher when no event was observed, and lower when an event is detected. As already explained, in some embodiments the reporting signal is not modulated when detecting one of the possible states, for example the state corresponding to the occurrence of an event being detected. In other embodiments the frequency is exploited as modulation parameter to indicate the detection of an event. The frequency of the reporting signal is then adapted, e.g., increased, when an event (a fault) is detected, e.g., when the threshold level is exceeded by the sampled current value.

In a digital implementation of the current supervisory device each operational cycle of the supervisory device can be seen as comprising three stages, namely the acquisition of a signal by the current sensing means, subsequently the processing as described above whereby a modulated output signal is produced based on the generated event signal and finally the outputting of the modulated output signal. The operational cycle corresponds to a certain time duration. The current supervisory device operates at a certain number of operational cycles per time unit. In an analog implementation of the current supervisory device the used signals occupy a certain operational bandwidth. In preferred embodiments of the current supervisory device according to the present invention the modulated reporting signal is higher in frequency than the operational bandwidth of the current supervisory device or than the number of operational cycles per second. In other words, the modulated output signal, i.e., the modulated reporting signal, supplies information on the monitored event at a faster rate than the rate at which the current sensing is performed. This higher rate offers the advantage that an alarm (in the form of the modulated output signal) can be reported much quicker in case e.g., an overcurrent situation is detected. In advantageous embodiments the modulated reporting signal has a frequency at least two times or five times or ten times higher than the operational speed (in cycles/s) applied in the supervisory device. For example, the operation speed of the current supervisory device may be 1 kHz or 2 kHz, and the modulated reporting signal frequency may be 4 kHz or 10 kHz or 20 kHz.

Figure 5:
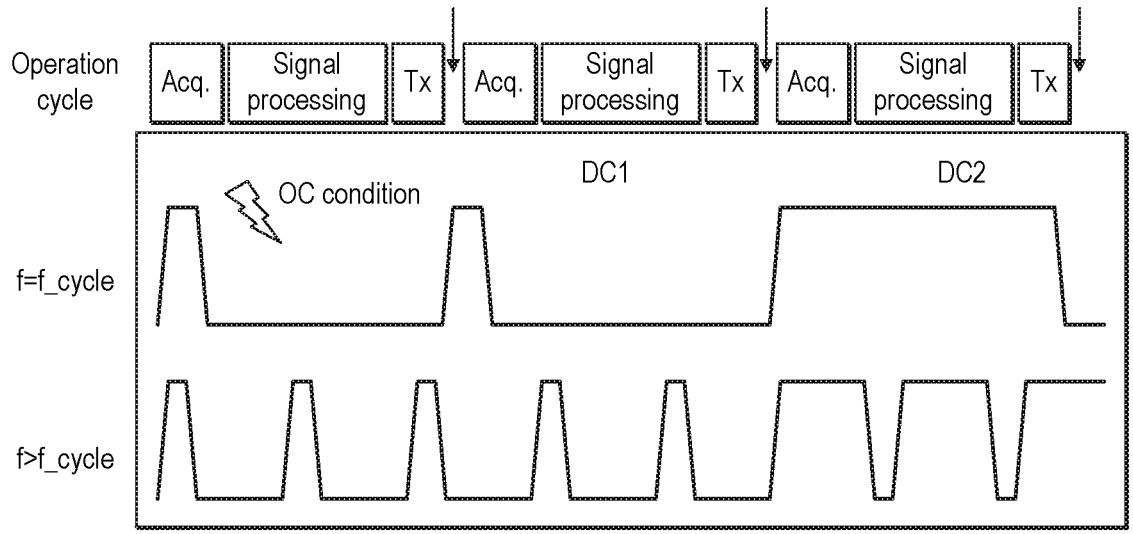
FIG. 5 illustrates the operation of the current supervisory device of the invention.

An illustration of the operation of a current supervisory device according to the invention is provided in FIG. 5. It shows a few operation cycles of the device. The example of an overcurrent situation is considered. As indicated an overcurrent (OC) situation occurs in the first cycle. The detection can only occur in the next cycle. At the end of this next cycle the event is reported. In the first timing diagram shown, this detection leads to an output signal with a different pulse width. Note that in this example the modulated reporting signal is the modulated event signal. Where the pulses had a duty cycle of 15% before, a modulated signal is output with a duty cycle of 85% when the overcurrent is detected. In the second timing diagram pulses are emitted at a higher frequency than the rate at which samples of the current values are received. The detection of the overcurrent leads to a change in pulse width of the modulated reporting signal that is output, while the frequency remains unchanged in this example. In other implementations, however, also the frequency may change. In certain embodiments the reporting signal is synchronised with the operation cycle (see for example the first timing diagram in FIG. 5), whereas in other embodiments the reporting signal is output asynchronously (as illustrated in the second timing diagram).

Figure 6:
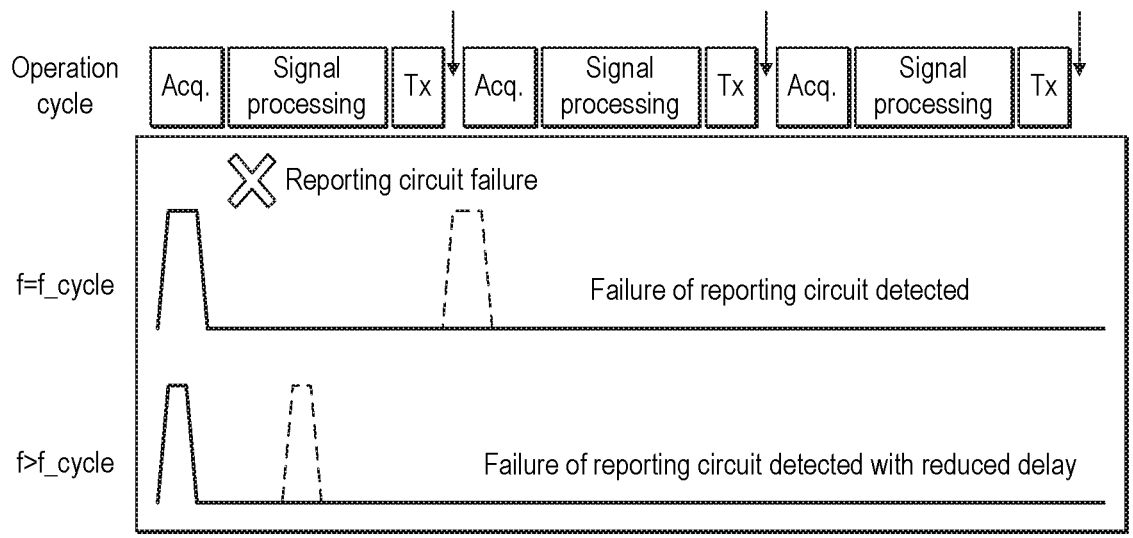
FIG. 6 illustrates the reporting of a circuit failure.

FIG. 6 illustrates the reporting of a circuit failure. A case is considered whereby a modulated pulse is output as reporting signal as long as no circuit failure is detected. After the detection of a failure no modulated signal is emitted, but rather a signal with a constant level as shown in FIG. 6. Alternatively, a signal with a ripple may be used, or for example a signal with a floating voltage. The reporting signal is output to e.g., an electronic control unit (ECU), which obviously must be capable of detecting the reporting signal. In the case depicted in FIG. 6 the ECU will detect the absence of a modulated pulse and so become aware that a failure has occurred. The second timing diagram illustrates an advantage of using a higher frequency for the reporting signal: the missing pulse is detected earlier and due to that reduced delay appropriate measures can be taken quicker.

Although in this description often the example is used of the occurrence or non-occurrence of an overcurrent, hence overcurrent monitoring, as an event, the skilled person will readily understand that there are many examples of other events to be monitored that can be considered. Other possible events may for example relate to monitoring the occurrence of a short circuit or of a malfunctioning electrical subsystem in a car, or functioning or malfunctioning of a car battery, or even the occurrence of a car crash.

In some embodiments a plurality of predefined thresholds can be provided. The threshold values can for example be stored in storage means of the processing circuit or loaded into the processing circuit from outside the current supervisory device. To each threshold then may correspond a different event signal and different modulated reporting signal. For example, different pulse widths and/or different frequencies can be used for the signals output as reporting signals. In some embodiments each threshold value is related to a different event, e.g., the occurrence (or non-occurrence) of a different fault like a current being above a certain threshold, an overcurrent, a malfunction in an electrical subsystem etc, as already mentioned before.

In other embodiments the plurality of predefined thresholds can be used to select an appropriate value from. The selection may for example be based on the state of a vehicle comprising the current supervisory device. The state may be e.g., the vehicle being parked or the vehicle driving or may be determined as a function of the vehicle speed. The selection may be performed inside the current supervisory device based on one or more identified parameters or, alternatively, may be performed from outside the current supervisory device, for example from the ECU.

Advantageously in some applications apart from the current a second physical quantity is monitored, like e.g. a temperature (e.g. the temperature of the current supervisory device itself) or a voltage, for example a battery voltage. In such embodiments the current supervisory device comprises voltage detection means and/or temperature detection means. The processing circuit then also receives a signal indicative of the one or more other sensed quantities. In accordance with the detected quantity a corresponding event signal is generated, which subsequently also serves as a further basis for modulating the output signal, together with the event signal that was generated from the signal indicative of the sensed current. In further embodiments more than one other physical quantity can be monitored apart from the current, e.g., both voltage and temperature. The current supervisory device may output a signal that differentiates between the different events. For example, the duty cycle may be 15% in case of a safe state, 35% in case an overtemperature was detected, 55% in case of an overvoltage, and 85% in case of an overcurrent.

In an aspect the invention relates to a system comprising a current supervisory device as described above and a conductor wherein the current to be sensed flows. The conductor may for example be a busbar for distributing power e.g., in a vehicle. Note that in that case all processing is still performed close to the busbar, more in particular in the processing circuit of the current supervisory device as explained above.

In an aspect the invention relates to a system comprising a current supervisory device as described above and an electronic device, like for example a fuse or a circuit breaker.

In a specific embodiment the electronic device is an electronic control unit (ECU) to which the modulated output signal is reported. To allow such reporting a communication channel towards the ECU is needed. When implemented in a vehicle, the system typically comprises such an ECU. In some embodiments this ECU may comprise a processing subcircuit that performs at least a part of the processing required in the derivation of the event signal. The processing subcircuit can be seen as a subcircuit of the processing circuit (9) discussed above and illustrated in FIGS. 1-3. The processing subcircuit may in some embodiments comprise a comparator (see also below).

In preferred embodiments the electronic device is provided with appropriate demodulation means for demodulating the modulated reporting signal received from the current supervisory device. The demodulation means may comprise duty cycle detection means and/or frequency detection means.

In one embodiment there is no filtering applied on the modulated reporting signal. The modulated reporting signal is then further processed by the demodulation means of the electronic device in a conventional way.

Figure 7:
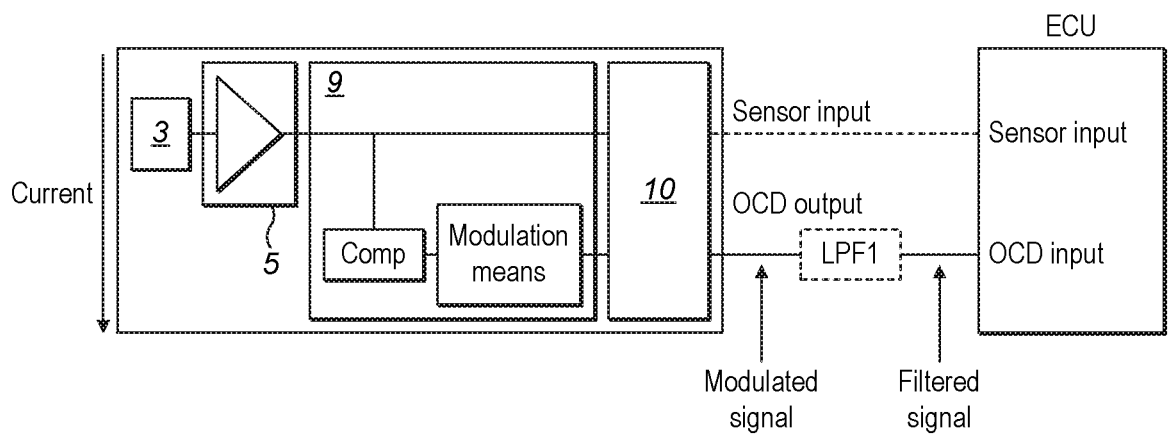
FIG. 7 illustrates a system comprising the current supervisory device and an electronic control unit, with low-pass filtering of the modulated signal output by the current supervisory device.

In some embodiments a low-pass filter is provided in the system in order to shape the pulses (i.e., reduce electromagnetic emissions). The pulses are preferably so shaped that high-frequency components at the entrance of the ECU are avoided as much as possible. The cut-off frequency of this low-pass filter is usually higher than the modulated signal frequency (e.g., 10 times higher or 100 times higher) such as to reduce higher harmonics of the signal. The low-pass filter can be implemented in the current supervisory device or in the ECU (e.g., in the above-mentioned processing subcircuit of the ECU) or may be performed on the communication channel between the current supervisory device and the ECU. The ECU is arranged to detect and demodulate the filtered modulated reporting signal. The ECU may for example be configured to measure pulse duration or signal frequency. This can be realized using conventional means known in the art, like for example timers and/or frequency-to-voltage converters and/or phase-locked loops (PLL) circuits. FIG. 7 provides an illustration. The modulated signal output by the current supervisory device is applied to a low-pass filter LPF1 and the filtered signal is next fed to the ECU. The filter LPF1 has a cut-off frequency higher than the frequency of the modulated signal. In an alternative embodiment the low-pass filtering is replaced by a pulse shaping by means of a digital-to-analog converter and a predetermined data sequence. This is another way to reduce or remove high-frequency content in the pulses. A predetermined data sequence corresponding to a bandwidth limited pulse (see e.g., FIG. 4) can be stored in a memory in the current supervisory device, and the DAC can be configured such as to output the data sequence (for example, to convert digital data into a voltage sequence) and to produce the bandwidth limited pulse.

In other embodiments another low-pass filter is implemented that transforms the modulated output signal into an averaged signal that somewhat resembles a DC signal. What is meant, is a signal with typically a substantially reduced peak-to-peak amplitude, e.g., less than 20%, or less than 10%, or less than 5% of the pulse amplitude. The level of the averaged signal is proportional to the duty cycle. For example, if a 15% duty cycle is used for the pulses, then the level of the averaged signal is approximately 15% VDD. The cut-off frequency of this low-pass filter is then lower than the modulated event signal frequency, e.g., 10 times lower, or 100 times lower. Again, the filtering can be performed in the current supervisory device or in the ECU or on the communication channel in between. The ECU can detect a voltage level (almost DC), e.g., based on a comparator provided in the ECU. For example, there can be an analog comparator coupled to a digital input of the ECU. Alternatively, the modulated reporting signal can be connected to an analog input of the ECU to digitize the signal and then perform the comparison digitally. In some embodiments the analog comparator can be integrated in the ECU. Optionally the ECU can also detect the pulse. Due to the modulation and low-pass filtering a decoupling of the supervisory device gets and the ECU is achieved and the rejection of spurious external interferences is improved. This only has a negligible impact on the filtered signal. An illustration is given in FIG. 8. The modulated reporting signal output by the current supervisory device is applied to a low-pass filter LPF2 to yield a DC-like averaged signal and this filtered signal is next fed to the ECU. The filter LPF2 now has a cut-off frequency lower than the frequency of the modulated signal.

Figure 8:
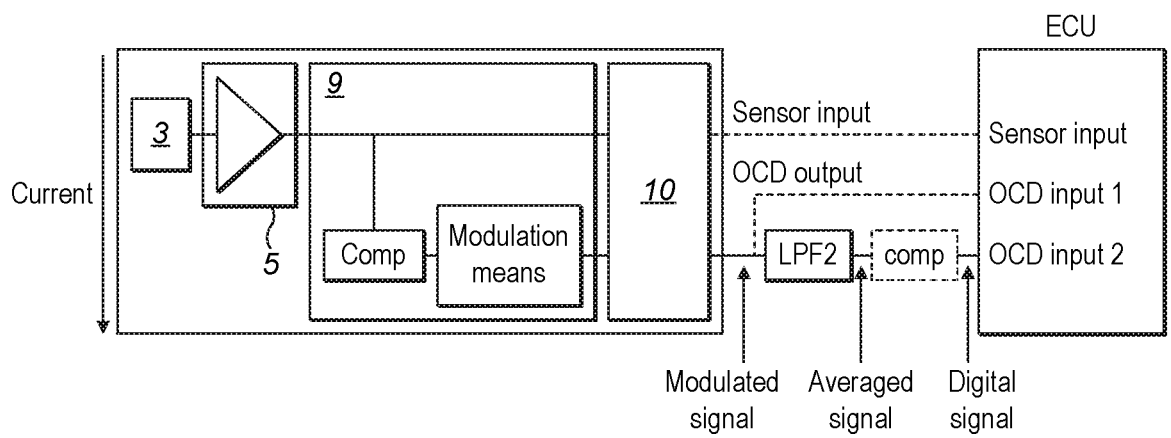
FIG. 8 illustrates a system comprising the current supervisory device and an electronic control unit, with low-pass filtering of the modulated signal output by the current supervisory device.

In the embodiment shown in FIG. 8 the ECU comprises two inputs for receiving the modulated signal: one for the modulated signal as output by the current supervisory device and one for a low-pass filtered version of the modulated signal (a DC-like averaged signal). As also indicated in FIG. 8, the averaged signal may optionally be compared via a comparator, which in some embodiments may be part of the ECU. The ECU may detect both the modulated signal in the time domain that was output by the current supervisory device and in the voltage domain at the output of LPF2, e.g., for redundancy, or only in the voltage domain at the output of LPF2. In other words, applying the modulated signal in the time domain is optional, as indicated by the dashed line in FIG. 8. As already said, optionally a comparator can be provided to compare the signals obtained as output of the voltage domain and time domain detection.

Figure 9:
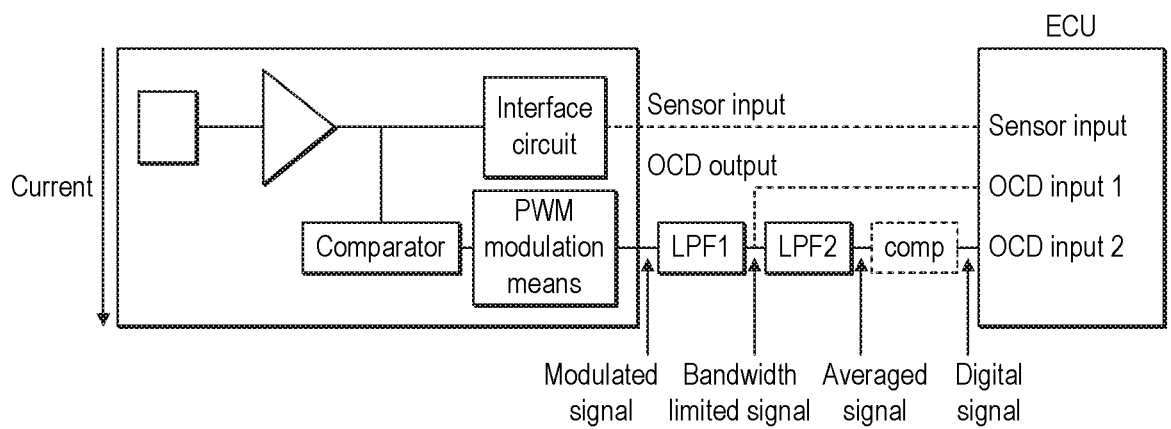
FIG. 9 illustrates a system comprising the current supervisory device and an electronic control unit, with low-pass filtering both for pulse shaping and for averaging.

In yet other embodiments both low-pass filters LPF1 and LPF2 as previously described are present. That means that both a low-pass filter for shaping the pulses and a low-pass filter to obtain an averaged, DC-like signal are present in the system. The various filters can be positioned in various ways, as already mentioned above. However, filter LPF1 should always precede filter LPF2. This is illustrated in FIG. 9.

Figure 10:
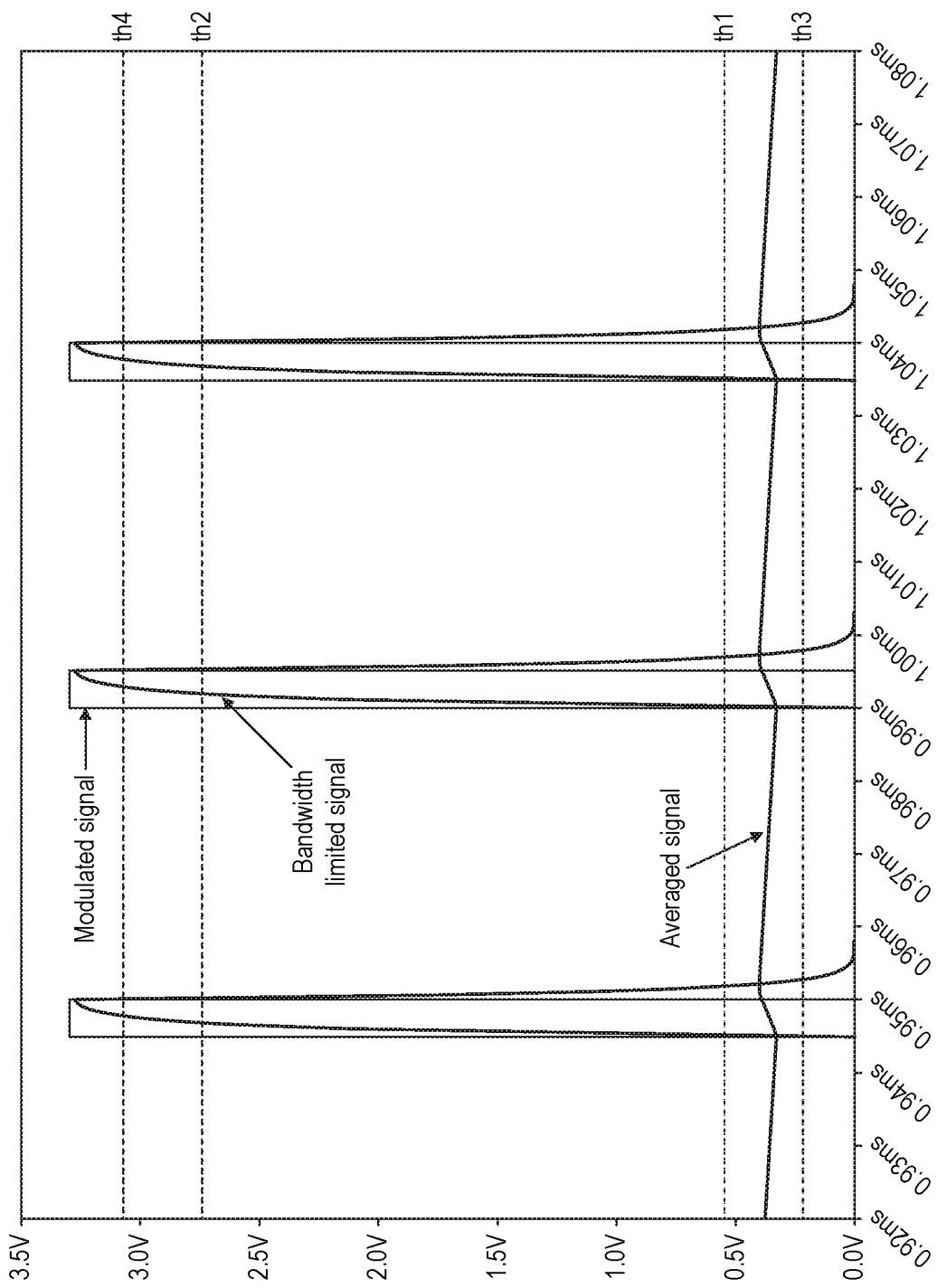
FIG. 10 illustrates a timing diagram for a system comprising the current supervisory device of this invention.

FIG. 10 represents a timing diagram for an embodiment of a system comprising a current supervisory device according to this invention. It shows a modulated signal (with a duty cycle of circa 10%), a bandwidth limited pulse derived from the modulated signal (using a cut-off frequency fcutoff>sample frequency fs), and a filtered averaged signal (fcutoff<fs) and detection thresholds for the event and 'no event' condition. As can be seen from the figure, the swing, or peak-to-peak amplitude of the averaged signal is relatively low, e.g., <20% or <10% of the modulated signal amplitude. In an embodiment, a single threshold is sufficient (e.g., at VDD/2, with VDD the supply voltage). In general, threshold levels can be set taking into account the supply voltage and applied duty cycle. In another embodiment, two thresholds can be used. For example, if the filtered signal is between th1 and th3, a safe state can be detected. In a variant, a safe state can be detected if the filtered averaged signal is below th1, and an overcurrent is above th2. In yet another embodiment, four thresholds can be used to check the presence of the filtered averaged signal. A safe state can be detected if the observed signal amplitude sf<th1 and sf>th3, and an overcurrent can be detected if the signal amplitude sf>th2 and sf<th4, and a different failure can be detected if the signal is not within these bands (e.g. short circuit to VDD or ground GND, or broken wire if the voltage is floating between the bands).

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A current supervisory device comprising:
   current sensing means for sensing a current;
   a circuit arranged to convert a signal received from said current sensing means into a signal indicative of the sensed current;
   a processing circuit arranged for receiving said signal indicative of the sensed current, for detecting an event based on said received signal, said detecting yielding an outcome corresponding to one of at least two different states, and for generating an event signal in accordance with said outcome, said processing circuit comprising modulation means for performing modulation based on said event signal; and
   an output terminal arranged for outputting a reporting signal received from said processing circuit, whereby at least one of at least two different states gives rise to said reporting signal being a modulated signal
   wherein said processing circuit is arranged to output for a further state of said at least two different states a further modulated signal having at least one modulation parameter different from said modulated signal.

2. The current supervisory device as in claim 1, wherein said modulation means is arranged to adapt a pulse width of pulses of said reporting signal.

3. The current supervisory device as in claim 1, wherein said modulated signal is modulated in frequency.

4. The current supervisory device as in claim 1, wherein said processing circuit comprises pulse shaping means for generating said reporting signal, said reporting signal being a bandwidth limited pulsed signal.

5. The current supervisory device as in claim 1, wherein said modulated signal has a frequency higher than the operational bandwidth or number of cycles per time unit of said current supervisory device.

6. The current supervisory device as in claim 1, wherein said processing circuit is arranged to detect said event by comparing said received signal with a predefined threshold.

7. The current supervisory device as in claim 6, wherein said processing circuit is arranged to detect said event by comparing said received signal with a plurality of predefined thresholds and wherein with each predefined threshold corresponds a different modulated signal.

8. The current supervisory device as in claim 1, wherein said modulated signal is a modulated version of said event signal.

9. The current supervisory device as in claim 1, wherein said event is the occurrence of a fault.

10. The current supervisory device as in claim 9, wherein said fault is an overcurrent.

11. The current supervisory device as in claim 1, wherein said current sensing means comprises a shunt resistor for generating a voltage drop and/or a magnetic sensing element.

12. The current supervisory device as in claim 1, further comprising voltage detection means for sensing a voltage and/or temperature detection means for sensing a temperature, and wherein said modulation means of said processing circuit is arranged for modulating said signal based on said event signal and on a signal indicative of said sensed voltage and/or said sensed temperature.

13. A system comprising a current supervisory device as in claim 1 and an electronic device arranged to receive said modulated signal.

14. The system as in claim 13, comprising filtering means to filter said modulated signal before applying said modulated signal to said electronic device.

15. The system as in claim 14, wherein said filtering means have a cut-off frequency lower than the modulated signal frequency.

16. The system as in claim 15, comprising further comparing means to compare said filtered modulated signal with at least one predetermined threshold level.

17. The system as in claim 14, wherein said filtering means comprises a low-pass filter having a cut-off frequency higher than the frequency of said modulated signal and is arranged to shape bandwidth limited pulses.

* * * * *